(12) United States Patent
Welch et al.

(10) Patent No.: US 10,439,114 B2
(45) Date of Patent: Oct. 8, 2019

(54) SUBSTRATES FOR LIGHT EMITTING DIODES AND RELATED METHODS

(71) Applicant: Cree, Inc., Durham, NC (US)

(72) Inventors: Erin R. F. Welch, Ann Arbor, MI (US); Colin Kelly Blakely, Franklinton, NC (US); Jesse Colin Reiherzer, Raleigh, NC (US); Arthur Fong-Yuen Pun, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/453,594

(22) Filed: Mar. 8, 2017

(65) Prior Publication Data

US 2018/0261741 A1 Sep. 13, 2018

(51) Int. Cl.
*H01L 33/62* (2010.01)
*H01L 33/50* (2010.01)
(Continued)

(52) U.S. Cl.
CPC .......... *H01L 33/62* (2013.01); *H01L 21/4846* (2013.01); *H01L 25/0753* (2013.01); *H01L 33/507* (2013.01); *H01L 33/54* (2013.01); *H01L 33/60* (2013.01); *H01L 33/505* (2013.01); *H01L 33/56* (2013.01); *H01L 2224/48091* (2013.01);
(Continued)

(58) Field of Classification Search
CPC ......... H01L 21/56; H01L 33/62; H01L 33/60; H01L 33/54; H01L 2933/0033; H01L 2933/005; H01L 2933/0066; H01L 33/46; H01L 33/0066; H01L 33/486; H01L 33/505; H01L 33/58; H01L 33/56; H01L 25/0753; H01L 31/02327; H01L 2933/0041; H01L 33/507; H01L 33/005; H01L 33/50
See application file for complete search history.

(56) References Cited

U.S. PATENT DOCUMENTS

| 4,918,497 A | 4/1990 | Edmond |
|---|---|---|
| 4,966,862 A | 10/1990 | Edmond |

(Continued)

FOREIGN PATENT DOCUMENTS

| DE | 202011050976 U1 | 11/2012 |
|---|---|---|
| EP | 2555262 A2 | 2/2013 |

(Continued)

OTHER PUBLICATIONS

International Searching Authority Partial Search and Invitation to Pay Additional Fees dated Apr. 11, 2018.
(Continued)

*Primary Examiner* — Caridad Everhart
(74) *Attorney, Agent, or Firm* — Jenkins, Wilson, Taylor & Hunt, P.A.

(57) ABSTRACT

Light emitting diode (LED) devices, components and systems are provided. Improved substrates for LEDs and LED devices are provided, with one or more dielectric layers over a reflective layer sufficient to minimize or eliminate damage of the dielectric layer(s). More stable and efficient LED devices can be produced using such improved substrates. LED devices, and methods of making the same, are also provided wherein LED chips are embedded in fill material to attach the LEDs to a substrate and increase light reflectivity.

36 Claims, 9 Drawing Sheets

(51) Int. Cl.
  *H01L 33/60* (2010.01)
  *H01L 21/48* (2006.01)
  *H01L 25/075* (2006.01)
  *H01L 33/54* (2010.01)
  *H01L 33/56* (2010.01)

(52) U.S. Cl.
  CPC .............. *H01L 2224/48137* (2013.01); *H01L 2224/73265* (2013.01); *H01L 2933/005* (2013.01); *H01L 2933/0033* (2013.01); *H01L 2933/0041* (2013.01); *H01L 2933/0066* (2013.01)

(56) References Cited

U.S. PATENT DOCUMENTS

| | | | |
|---|---|---|---|
| 5,027,168 | A | 6/1991 | Edmond |
| 5,210,051 | A | 5/1993 | Carter, Jr. |
| 5,338,944 | A | 8/1994 | Edmond et al. |
| 5,359,345 | A | 10/1994 | Hunter |
| 5,393,993 | A | 2/1995 | Edmond et al. |
| 5,416,342 | A | 5/1995 | Edmond et al. |
| 5,523,589 | A | 6/1996 | Edmond et al. |
| 5,604,135 | A | 2/1997 | Edmond et al. |
| 5,631,190 | A | 5/1997 | Negley |
| 5,739,554 | A | 4/1998 | Edmond et al. |
| 5,912,477 | A | 6/1999 | Negley |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,600,175 | B1 | 7/2003 | Baretz et al. |
| 6,791,119 | B2 | 9/2004 | Slater, Jr. et al. |
| 6,853,010 | B2 | 2/2005 | Slater, Jr. et al. |
| 6,958,497 | B2 | 10/2005 | Emerson et al. |
| 7,095,056 | B2 | 8/2006 | Vitta et al. |
| 7,213,940 | B1 | 5/2007 | Van de Ven et al. |
| 7,456,499 | B2 | 11/2008 | Loh et al. |
| 7,564,180 | B2 | 7/2009 | Brandes |
| 7,655,957 | B2 | 2/2010 | Loh et al. |
| 7,802,901 | B2 | 9/2010 | McMillan |
| 7,821,023 | B2 | 10/2010 | Yuan et al. |
| 7,952,544 | B2 | 5/2011 | Roberts |
| 7,960,819 | B2 | 6/2011 | Loh et al. |
| 7,999,283 | B2 | 8/2011 | Chakraborty et al. |
| 8,018,135 | B2 | 9/2011 | Van de Ven et al. |
| 8,044,418 | B2 | 10/2011 | Loh et al. |
| 8,125,137 | B2 | 2/2012 | Medendorp, Jr. et al. |
| 8,264,138 | B2 | 9/2012 | Negley et al. |
| 8,337,071 | B2 | 12/2012 | Negley et al. |
| 8,410,679 | B2 | 4/2013 | Ibbetson et al. |
| 8,425,271 | B2 | 4/2013 | Hussell et al. |
| 8,563,339 | B2 | 10/2013 | Tarsa et al. |
| 8,729,589 | B2 | 5/2014 | Hussell et al. |
| 8,866,410 | B2 | 10/2014 | Negley et al. |
| 8,970,131 | B2 | 3/2015 | Brandes et al. |
| 9,024,349 | B2 | 5/2015 | Chitnis et al. |
| 9,131,561 | B2 | 9/2015 | Athalye |
| 9,159,888 | B2 | 10/2015 | Chitnis et al. |
| 9,277,605 | B2 | 3/2016 | Ni |
| 9,414,454 | B2 | 8/2016 | Brandes et al. |
| 9,461,201 | B2 | 10/2016 | Heikman et al. |
| 2006/0221272 | A1 | 10/2006 | Negley et al. |
| 2007/0104828 | A1 | 5/2007 | Fornaguera |
| 2009/0050908 | A1 | 2/2009 | Yuan et al. |
| 2009/0114934 | A1* | 5/2009 | Horng ............... H01L 33/60 257/98 |
| 2010/0193822 | A1* | 8/2010 | Inobe ............... H01L 33/54 257/98 |
| 2011/0068702 | A1 | 3/2011 | Van de Ven et al. |
| 2012/0264290 | A1* | 10/2012 | Reid ............... C25D 7/123 438/653 |
| 2012/0326188 | A1* | 12/2012 | Han ............... H01L 33/60 257/98 |
| 2013/0341634 | A1 | 12/2013 | Heikman et al. |
| 2014/0159064 | A1* | 6/2014 | Sakariya ............ H01L 25/0753 257/88 |
| 2015/0069438 | A1* | 3/2015 | Tong ............... H01L 33/10 257/98 |
| 2015/0257211 | A1 | 9/2015 | Johnson et al. |
| 2016/0018078 | A1 | 1/2016 | Katoh et al. |
| 2016/0020370 | A1* | 1/2016 | Cai ............... H01L 33/60 257/88 |
| 2016/0276545 | A1* | 9/2016 | Mueller ............... H01L 33/486 |
| 2016/0284952 | A1 | 9/2016 | Takeda |
| 2016/0293811 | A1 | 10/2016 | Hussell et al. |
| 2017/0160590 | A1* | 6/2017 | Kimme ............ G02F 1/133605 |
| 2017/0190878 | A1* | 7/2017 | Iimura ............... C08K 5/549 |
| 2017/0293169 | A1* | 10/2017 | Braun ............ G02F 1/133504 |

FOREIGN PATENT DOCUMENTS

| | | |
|---|---|---|
| EP | 2927971 A1 | 10/2015 |
| JP | 2016201525 A | 12/2016 |
| WO | WO 2018/164870 A1 | 9/2018 |

OTHER PUBLICATIONS

International Search Report and Written Opinion for Application PCT/US2018/019747 dated Jun. 14, 2018.

\* cited by examiner

SUBSTRATES FOR LIGHT EMITTING DIODES AND RELATED METHODS

TECHNICAL FIELD

The subject matter disclosed herein relates generally to light emitting diodes (LEDs), components, and related methods. More particularly, the subject matter disclosed herein relates to metal substrate enhancements for use with top-side contact LEDs and related methods.

BACKGROUND

Light emitting diodes or LEDs are solid state devices that convert electrical energy into light. LEDs can be utilized in light emitter devices or components for providing different colors and patterns of light useful in various lighting and optoelectronic applications. Top-side contact LEDs can be mounted to a substrate having a reflective layer to optimize light output and efficiency. However, there can be a need to protect the reflective layer from damage from exposure to environmental elements. Existing protective layers have proven to be ineffective.

More particularly, the dielectric layer in some substrates is susceptible to cracking, developing pinholes or otherwise degrading. This is a common problem with existing substrates having a reflective layer. Cracks or other defects in a dielectric layer covering a mirrored or reflective substrate, and particularly a silver (Ag) reflective or mirrored substrate, can result in openings or pinholes through which the Ag can migrate. Such defects can cause dark spots in the reflective and/or light emitting area which can absorb light and compromise emission output, including changing the color of the light output and/or decreasing the brightness.

Manufacturers of LED lighting products are constantly seeking ways to improve the reliability and efficiency of the products and encourage the adoption of LED products. LEDs that produce light at optimal outputs and under enhanced performance, particularly while being more reliable and stable, are becoming more desirable.

Thus, despite the availability of various light emitter devices and components in the marketplace, a need remains for devices, components, and methods that can be produced quickly, efficiently, at a lower cost, and with improved performance and reliability characteristics.

SUMMARY

Substrate based LEDs, components, and related methods having improved reliability and performance are provided and described herein. Devices, components, and methods described herein can advantageously exhibit improved processing times, ease of manufacture, and/or lower processing costs. Devices, components, and related methods described herein can be well suited for a variety of applications such as personal, industrial, and commercial lighting applications including, for example, light bulbs and light fixture products and/or applications. In some aspects, devices, components, and related methods described herein can comprise improved LED manufacturing processes and/or improved optical properties including more consistent and uniform light emission and color. Such devices can be less expensive and more efficient.

Improved substrates for LEDs and LED devices are provided. An example substrate can comprise one or more dielectric layers disposed over a reflective layer sufficient to minimize, mitigate or eliminate damage of the dielectric layer(s). More stable and efficient LED devices can be produced using such improved substrates. As a further example, LED devices and methods of making the same are also provided wherein LEDs can be embedded in fill material to attach the LEDs to a substrate and increase light reflectivity.

These and other objects of the present disclosure as can become apparent from the disclosure herein are achieved, at least in whole or in part, by the subject matter disclosed herein.

BRIEF DESCRIPTION OF DRAWINGS

A full and enabling disclosure of the present subject matter is set forth more particularly in the remainder of the specification, including reference to the accompanying figures, relating to one or more embodiments, in which:

FIGS. 2A-2D are images of a prior art substrate showing degradation of a reflective layer allowed by damage in an existing encapsulating layer disposed over the reflective layer;

Figure 3A:
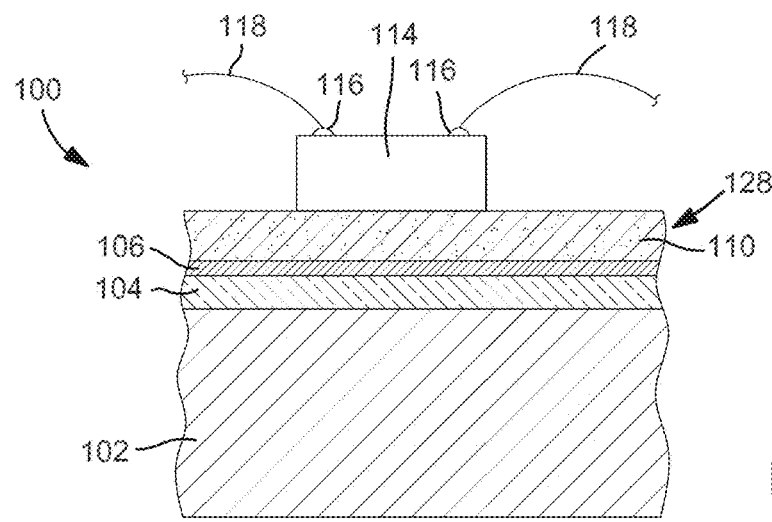
Figure 3B:
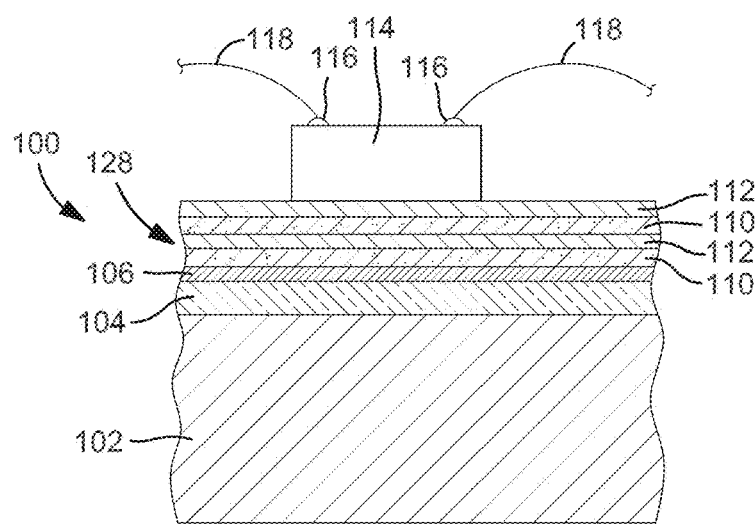
Figure 3C:
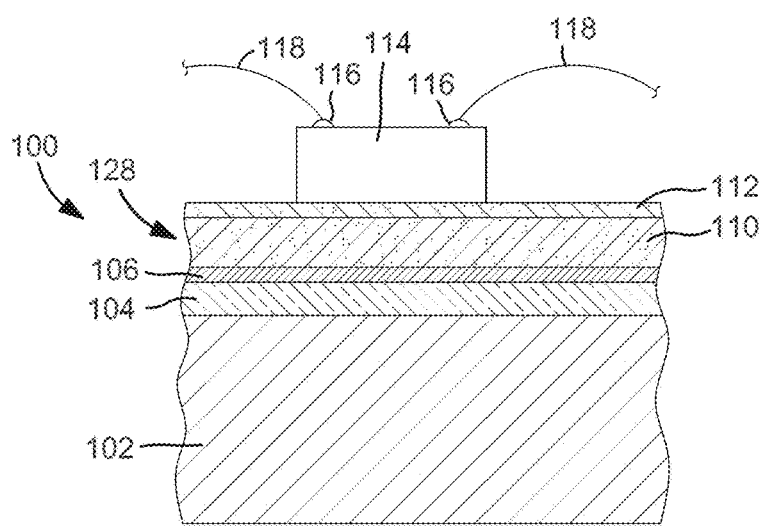
Figure 4A:
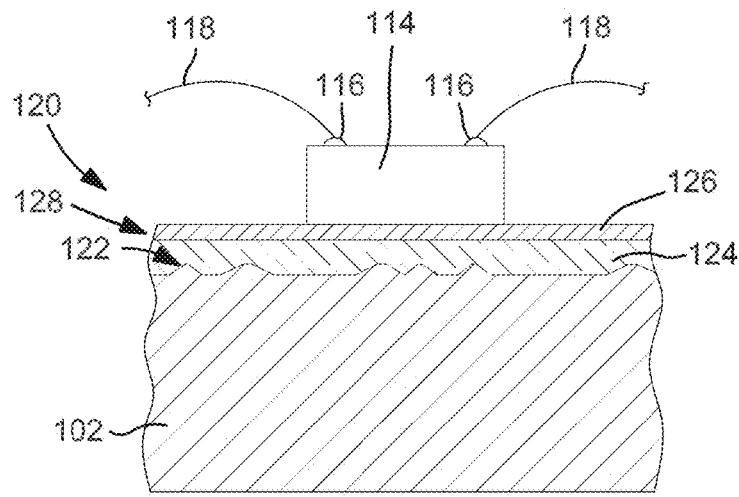
Figure 4B:
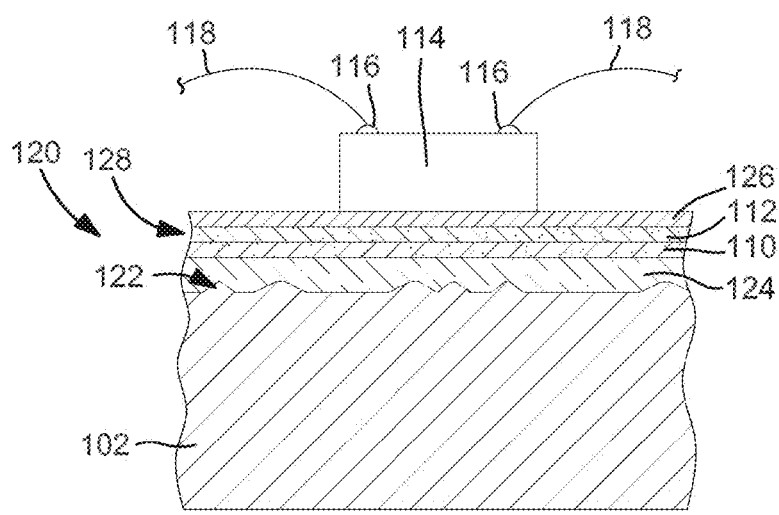

damage of an existing dielectric layer over a reflective layer;

FIGS. 3A-3C are cross-sectional views of embodiments of substrate arrangements for LED devices;

FIGS. 4A and 4B are cross-sectional views of embodiments of substrate arrangements for LED devices; and FIGS. 5A-5F are cross-sectional views of LED device arrangements.

DETAILED DESCRIPTION

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

Unless the absence of one or more elements is specifically recited, the terms "comprising", "including", and "having"

as used herein should be interpreted as open-ended terms that do not preclude the presence of one or more elements. Like numbers refer to like elements throughout this description.

It will be understood that when an element such as a layer, region, or substrate is referred to as being "on" another element, it can be directly on the other element or intervening elements can be present. Moreover, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the apparatus in addition to the orientation depicted in the figures. For example, if the apparatus in the figures is turned over, structure or portion described as "above" other structures or portions would now be oriented "below" the other structures or portions.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic or metal boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters. Electrical traces described herein provide electrical power to the emitters for electrically activating and illuminating the emitters. Electrical traces may be visible and/or covered via a reflective covering, such as a solder mask material, Ag, or other suitable reflector.

In some embodiments, one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

Phosphor and phosphor compounds as disclosed herein can comprise one or more of a wide variety of wavelength conversion materials or color conversion components including luminescent materials. Examples of luminescent materials (lumiphors) include phosphors, Cerium-doped Yttrium Aluminum Garnet (YAG) (e.g. LuAG:Ce), Nitrides, Oxy-Nitrides, scintillators, day glow tapes, nanophosphors, quantum dots (e.g., such as provided by NNCrystal US Corp., Fayetteville, Ark.), and inks that glow in the visible spectrum upon illumination with (e.g., ultraviolet) light. Inclusion of lumiphors in wavelength conversion components or related components as disclosed herein, in conjunction with solid state light emitters and LEDs, can be accomplished by providing layers (e.g., coatings) of such materials over solid state emitters and/or by dispersing luminescent materials to a clear encapsulant (e.g., epoxy-based or silicone-based curable resin or other polymeric matrix) arranged to cover one or more solid state light emitters. One or more luminescent materials useable in devices as described herein may be down-converting or up-converting, or can include a combination of both types.

Wavelength conversion materials can provide benefits including, for example, improved long term reliability (e.g., improved properties at around 1000 hours or more and 85° C., 105° C., and/or 125° C.), decreased bubbling around solid state light emitters, a larger viewing angle, lower dCCT color spread, cooler phosphor temperatures, brighter light emission, improved sulfur resistance, and/or a smaller color point spread, including all or any combination of such features.

The presently disclosed subject matter is directed to different embodiments of LED package structures having a light source that comprises LEDs. The LED packages can be arranged in different ways and are relatively small, while at the same time are efficient, reliable and cost effective. The embodiments according to the disclosure herein can have different shaped encapsulants, but can emit with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

The disclosure herein is described herein with reference to certain embodiments, but it is understood that the disclosure herein can be embodied in many different forms and should not be construed as limited to the embodiments set forth herein. In particular, the disclosure herein is described below in regards to certain LED packages having LEDs in different configurations, but it is understood that the disclosure herein can be used for many other LED packages with other LED configurations. The LED packages can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

Coatings, encapsulants, encapsulant layers, and the like are disclosed herein, and can comprise any material that provides mechanical, chemical, and/or environmental protection to a substrate, reflective layer or other LED component. A coating, encapsulant and/or encapsulant layer can be configured in some embodiments as a layer that covers a substantially horizontal or vertical surface, and in some aspects can comprise a layer disposed on top of another layer, surface or structure whether or not it fully surrounds all sides of the other layer, surface or structure. In some embodiments a coating, encapsulant and/or encapsulant layer can comprise or consist of a dielectric as disclosed herein. It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

Disclosed herein are coatings for mirrored or reflective substrates. Such reflective substrates can be configured for use in lighting applications, such as for example LEDs. In some aspects, the coated substrates and methods of making the same can be particularly useful with top-side contact LED chips with a silicone/epoxy attach. The disclosed coating materials can increase the reflectivity and/or reliability of commercially available aluminum (Al) and/or silver (Ag) substrates, including for example substrates comprising a metal base, e.g. Al, with an Ag mirrored surface. In some embodiments a reflective layer can comprise multiple reflective components as disclosed in U.S. Pat. No. 9,461,201, the entire contents of which is incorporated herein by reference.

One particular application for the disclosed coatings and related methods includes the application of the disclosed coatings to mirrored substrates, including Ag mirrored substrates, with an encapsulating layer, such as for example a dielectric layer. Some substrates that are available for use in manufacturing LEDs include a reflective layer and a single dielectric layer, which can reduce the overall manufacturing cost and complexity. However, the encapsulating or dielectric layer in such substrates is susceptible to cracking or incomplete coverage due to the inherent roughness or defects of the base substrate and insufficient thickness of the encapsulating or dielectric layer to completely conform around these features. This is a common problem with existing substrates. Cracks or other defects in a dielectric layer covering a mirrored substrate, and particularly an Ag reflective or mirrored substrate, can cause openings or pinholes through which the Ag can migrate. Such defects can result in development of dark spots in the reflective and/or light emitting area during operation of the LED device, which can disadvantageously absorb light and compromise emission outputs, including changing the color of the light output and/or decreasing the brightness. The disclosed coating materials and related methods can minimize, mitigate or eliminate this problem by blocking the Ag migration through cracks and pinholes in existing dielectric layers on substrate materials and can also increase sulfur resistance.

The coating materials disclosed herein can comprise any number of encapsulating layers, coatings and/or dielectric materials and compounds, including for example silicon oxide, silicon nitride, aluminum oxide, titanium dioxide, non-metallic oxides, non-metallic nitrides, tantalum oxide, aluminum, nickel, titanium, tungsten, platinum, combinations thereof or alloys thereof, etc. In some aspects such encapsulants, coatings and/or dielectrics can comprise one or more materials arranged to provide desired electrical isolation and high thermal conductivity. For example, a dielectric can provide a desired electrical isolation between electrical traces and/or sets of solid state emitters. In some aspects, such substrates can comprise ceramic such as alumina ($Al_2O_3$), aluminum nitride (AlN), silicon carbide (SiC), silicon, or a plastic or polymeric material such as polyimide, polyester, metal, etc.

In some embodiments, the coating materials can also include distributed Bragg reflectors (DBR) or other non-metal reflective layers, generally referred to as dielectric reflectors. The coating materials can be applied in a single layer or in a plurality of layers, with such layers having varying thicknesses and combinations.

Figure 1A:
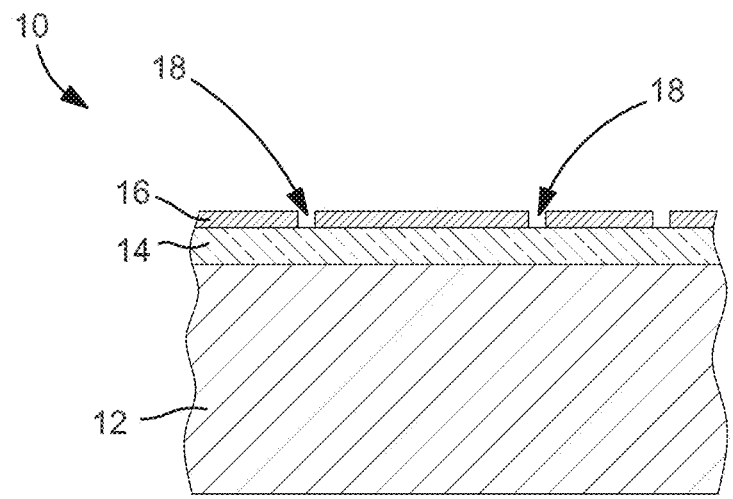
FIGS. 1A-1B are cross-sectional views of a prior art substrate for an LED.
Figure 1B:
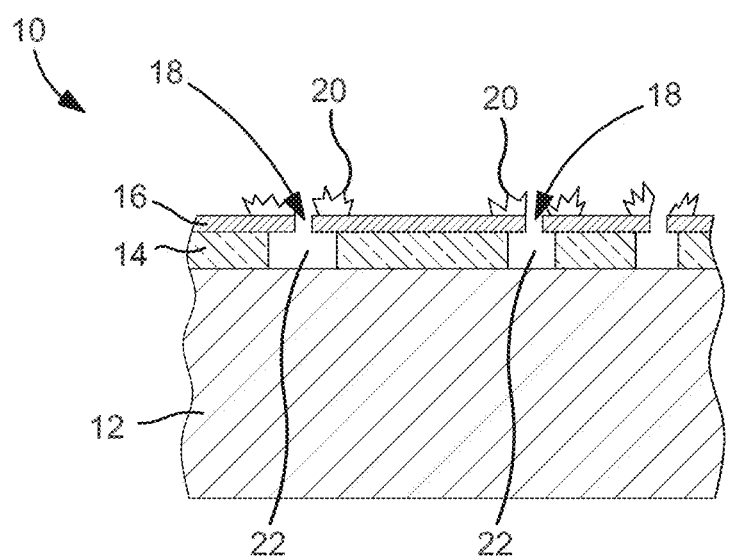

FIGS. 1A-1B are cross-sectional views of a prior art substrate generally designated 10. Substrate 10 comprises a substrate 12 and reflective layer 14. Reflective layer 14 can comprise any reflective material, including for example silver (Ag). A dielectric layer 16 is often provided on an upper surface of reflective layer 14. Dielectric layer 16 can comprise any dielectric or non-conductive material, including for example, $TiO_2$. Dielectric 16 is intended to protect the reflective surface of reflective layer 14. However, it has been discovered that dielectric layer 16 can break down, degrade, crack or otherwise contain defects causing openings 18, or pinholes, in dielectric layer 16. Openings 18 in dielectric layer 16 expose reflective layer 14 and in some cases allows components of reflective layer 14 to migrate through openings 18. As shown in FIG. 1B, reflective layer 14 can degrade or deteriorate at points of damage 22 proximate to openings 18, in some embodiments causing migration of reflective material 14 through dielectric layer 16 leaving deposits 20 of reflective material, e.g. Ag, in undesired areas such as on an upper surface of reflective layer 14. This degrades the quality of the substrate, particularly in LED applications.

Figure 2A:
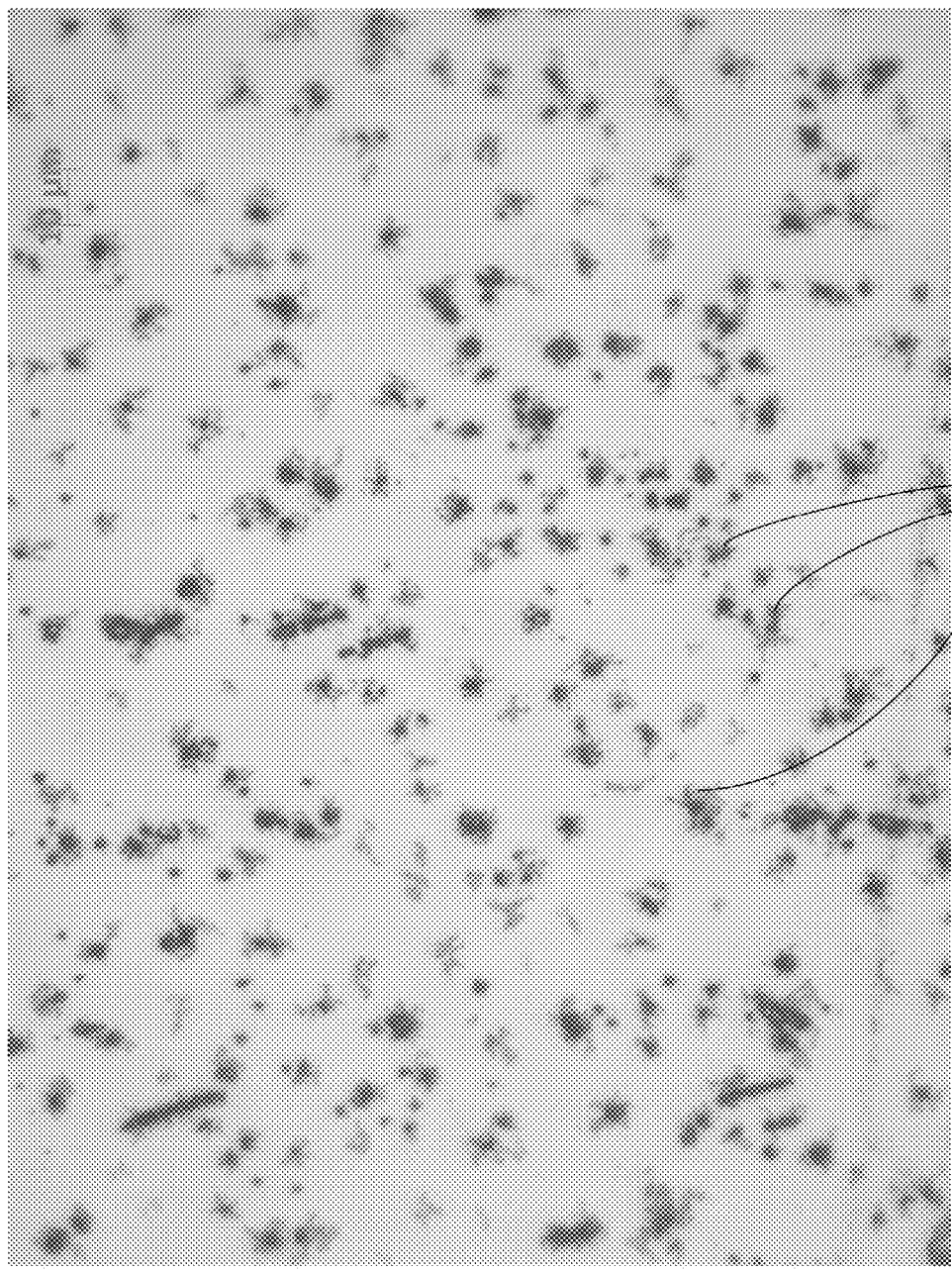
Figure 2B:
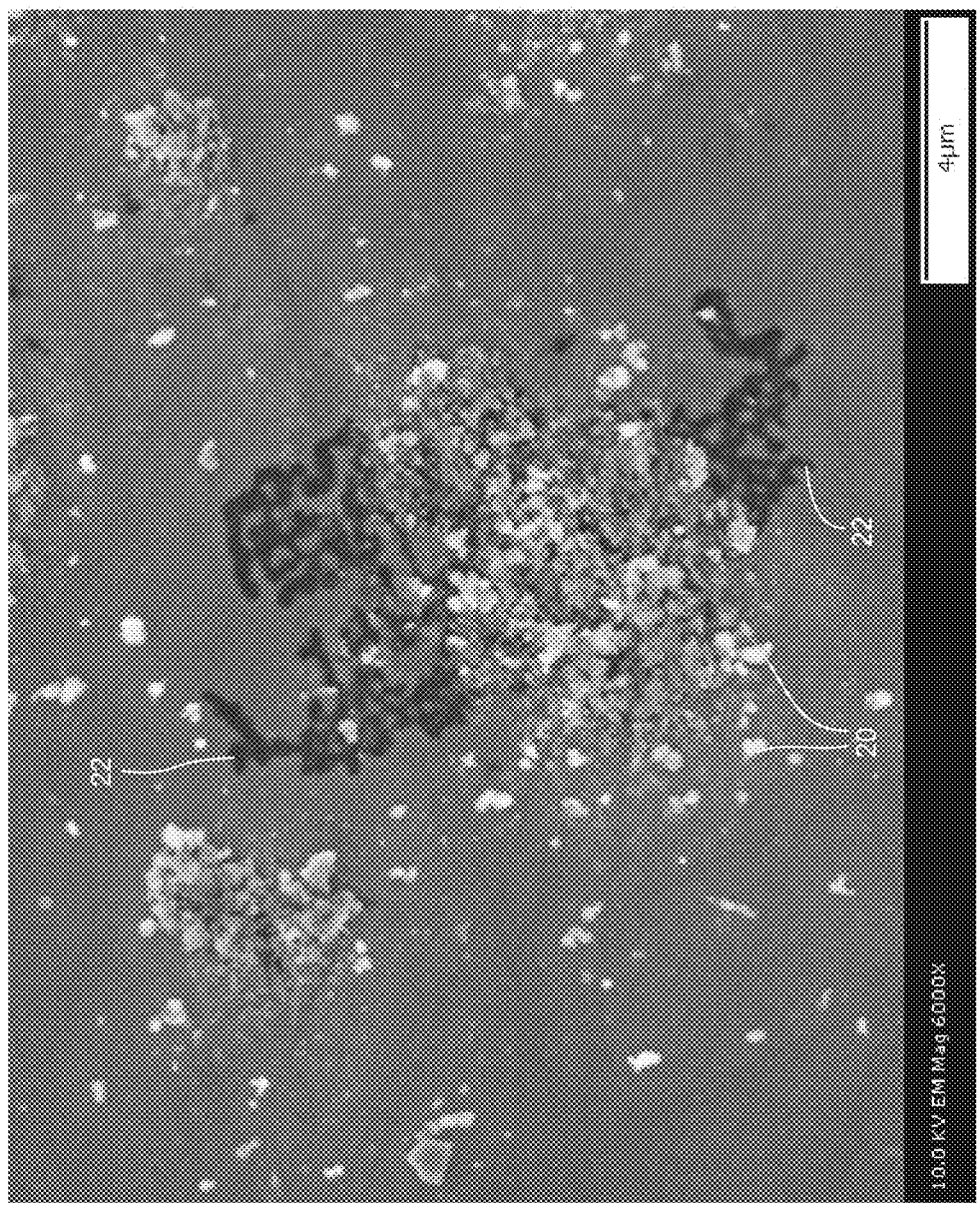
Figure 2D:
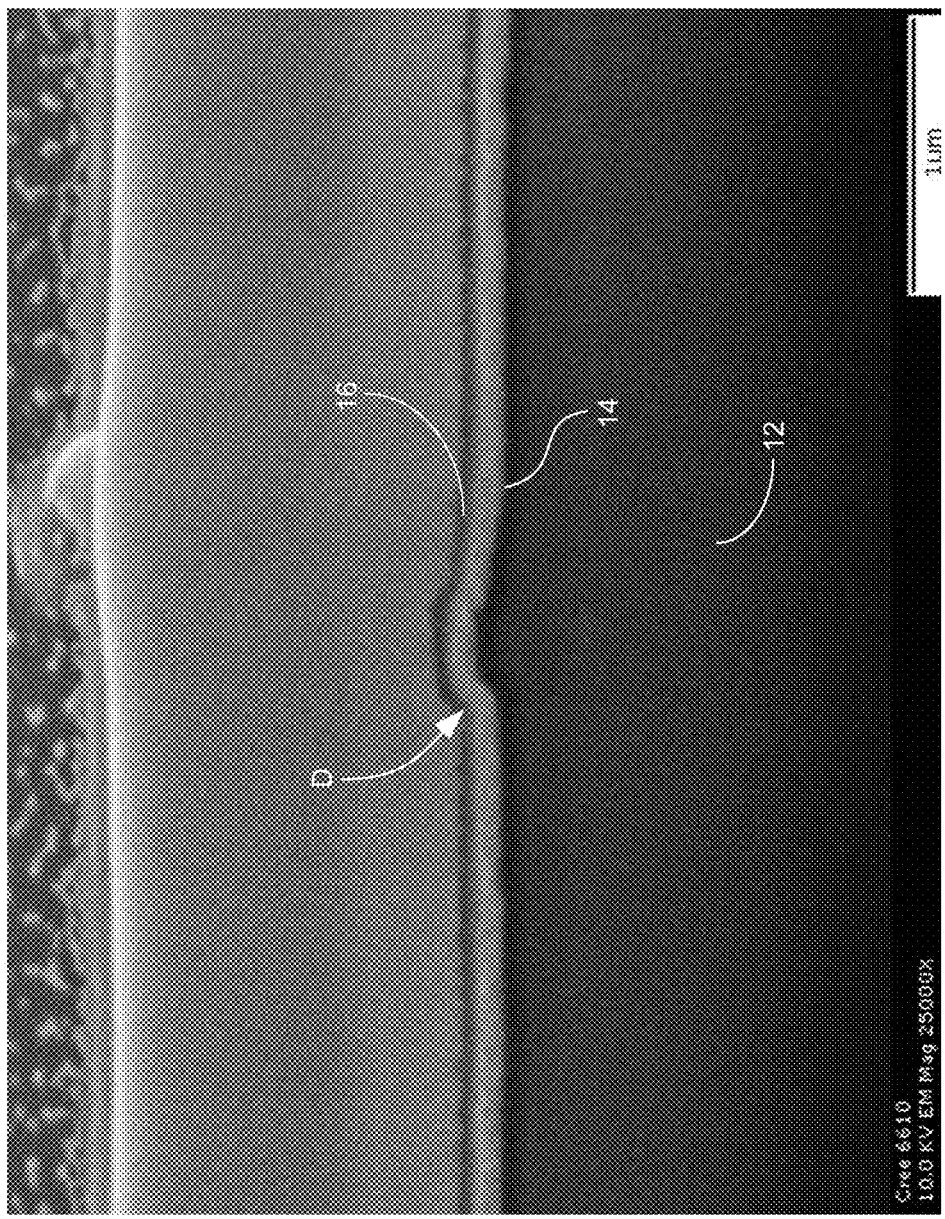

FIGS. 2A-2C are images of a substrate showing damage of an existing dielectric layer over a reflective layer and the degradation of the reflective layer after extended operation of the LED device. FIG. 2A is an overhead image of an upper surface of a substrate illustrated in FIGS. 1A-1B and described above. The visible dark spots are points of degradation 22 in the reflective layer allowed by pinholes or other defects in the dielectric layer that expose the underlying reflective layer, here Ag. FIG. 2B is another overhead image of an upper surface of a substrate like that illustrated in FIGS. 1A-1B and described above. The visible dark spots are points of degradation 22 in the reflective layer allowed by pinholes or other defects in the dielectric layer that expose the underlying reflective layer. The lighter material adjacent to points of degradation 22 are deposits 20 of Ag that has migrated from the underlying reflective layer to the upper surface. FIG. 2C is an image of a cross-sectional view of the substrate shown in FIG. 2A. Substrate 12 has a reflective layer 14 on an upper surface and a dielectric layer 16 disposed above the reflective layer 14. As is visible in the image, points of degradation 22 are present in reflective layer 14 with deposits 20 of Ag that have migrated above dielectric layer 16. Platinum (Pt) 24 can be added to facilitate the cross-sectional cut by focused ion beam (FIB). FIG. 2D is an image of a cross-sectional view of a substrate similar to that of FIG. 2C, showing a defect D in dielectric 16, where the dielectric is thin and/or broken which can lead to the damage or degradation and migration of reflective layer 14 as shown in FIG. 2C. Thus, disclosed herein are coatings and methods of applying coatings to remedy this problem and provide LED substrates and devices with improved reliability and optimized performance.

FIGS. 3A-3C illustrate cross-sectional views of embodiments of substrate arrangements for LED components or devices with the disclosed coating materials. Each of FIGS. 3A-3C includes a cross-sectional view of an LED component or device, generally designated 100, comprising substrate 102, reflective layer 104, and LED 114, which can be an LED chip. In some aspects, the entire LED component or device can be covered by an encapsulating layer, for example a standard epoxy/silicone encapsulating layer with phosphor and/or other material.

Substrate 102 can comprise any metal substrate suitable for lighting devices, including for example aluminum. Additionally, in some aspects, substrate 102, or a submount, can comprise a printed circuit board (PCB), a metal core printed circuit board (MCPCB), a flexible printed circuit board, a dielectric laminate, a ceramic based substrate, or any other suitable substrate for mounting LEDs and/or LED packages.

Reflective layer 104 can comprise any reflective material or mirrored surface, including for example Ag. In some aspects, an encapsulating layer such as encapsulating layer 106 can be provided on an upper surface of reflective layer 104. Encapsulating layer 106 can comprise any dielectric or non-conductive material, including for example, $TiO_2$. Encapsulating 106 can be configured to protect and seal the reflective surface of reflective layer 104.

In some aspects, encapsulating layer 106 can be a layer of any material that can prevent migration of the underlying reflective materials. For example, encapsulating layer 106 can be a metal encapsulating layer that comprises metal or consists of metal and without any other material disposed on the metal encapsulating layer such as a dielectric or other layer. As examples and without limitation, the metal encapsulating layer can comprise aluminum, nickel, titanium, tungsten, platinum, combinations thereof or alloys thereof. The metal encapsulating layer can be very thin and in some aspects for example can be from around 10 nanometers (nm) to about 100 nm. In other aspects, the metal encapsulating layer can be from about 30 nm to about 70 nm or any thickness or thickness range within that range. Having the metal encapsulation layer thin means that light can still pass through the metal encapsulating layer and the reflective layer below the metal encapsulating layer can still reflect light. If the metal encapsulating layer is too thick, the metal encapsulating layer can become absorbing.

In some aspects, encapsulating layer 110 can be added to encapsulating layer 106 to form a single or plurality of encapsulating layers of a desired thickness. Such a configuration can reduce, eliminate or minimize cracking, pin holes or damage of encapsulating layer 106. Encapsulating layer 110 can in some aspects be considered an additional or supplementary encapsulating layer. To the extent that defects, cracks or pin holes already exist in encapsulating layer 106, encapsulating layer 110 not only covers encapsulating layer 106 but also fills or otherwise blocks any openings or defects in encapsulating layer 106. Thus, in some aspects encapsulating layer 110 can be configured to provide additional protection to reflective surface 104 by preventing exposure to environmental elements.

In some embodiments, substrate 102 with reflective surface 104, or reflective layer, comprises a encapsulating layer portion generally designated 128 disposed over the reflective layer, wherein the encapsulating layer portion 128 can comprise at least a first encapsulating layer 106 and a second encapsulating layer 110 disposed over the first encapsulating layer 106. Such an encapsulating layer portion 128 can have a thickness for example of from about 100 nanometers (nm) to about 1 micron (um). The thickness can in some aspects be for example from about 100 nm to about 500 nm, or any thickness or range of thickness within that range. Where encapsulating layer portion 128 comprises multiple layers, i.e. first encapsulating layer 106 and second encapsulating layer 110 or with any additional encapsulating layer combined, the overall or combined thickness can have a minimum thickness of at least about 100 nanometers (nm) to about 1 micron (um), or about 100 nm to about 500 nm, or any thickness or range of thickness within that range to minimize, mitigate or eliminate damage of the encapsulating layer portion 128. The thickness of individual layers of encapsulant can vary depending on the material used in the encapsulant, with some encapsulating layers being thicker than others. In some aspects the encapsulating layer portion 128, e.g. first encapsulating layer 106 and second encapsulating layer 110, can comprise multiple encapsulating layers of alternating or different materials, in some aspects each having substantially different or substantially the same thicknesses. Encapsulating layer portion 128 can comprises multiple encapsulating layers of alternating materials. Alternatively, in some embodiments encapsulating layer portion 128 can comprise a single encapsulating layer.

FIG. 3A also shows an optional LED 114 disposed above and/or attached to the encapsulating layer portion 128, and particularly encapsulating layer 110. LED 114 can in some embodiments comprise a top-side contact LED, which can include electrical connection 116 and one or more wire bonds 118. Although only shown with one exemplary LED 114, multiple LEDs can be provided on such a substrate, and interconnected or electrically connected. LED device 100, including substrate 102 with improved functionality and reliability, can be used in an LED component, device or lighting system. In some aspects, the entire LED device 100 can be covered by an encapsulating layer, for example a standard epoxy/silicone encapsulating layer with phosphor and/or other material.

Similar to FIG. 3A, FIG. 3B is a cross-sectional view a LED device 100 comprising substrate 102, reflective layer 104, encapsulating layer 106, and LED chip 114. In some aspects, a plurality of encapsulating layers 110 and 112 can be added to encapsulating layer 106 to form a single or plurality of encapsulating layers of a desired thickness. In some embodiments, and as illustrated in FIG. 3B, substrate 102 with reflective surface 104, or reflective layer, comprises encapsulating layer portion 128 disposed over the reflective layer, wherein the encapsulating layer portion 128 comprises at least a first encapsulating layer 106, a second encapsulating layer 110, and third encapsulating layer 112, disposed over the first encapsulating layer 106. Such an encapsulating layer portion 128 can have a thickness for example of from about 100 nanometers (nm) to about 1 micron (um). The thickness can in some aspects be for example from about 100 nm to about 500 nm, or any thickness or range of thickness within that range. Where encapsulating layer portion 128 comprises multiple layers, i.e. first encapsulating layer 106, second encapsulating layer 110, and third encapsulating layer 112 combined, the overall or combined thickness can have a minimum thickness of from at least about 100 nanometers (nm) to about 1 micron (um), from about 100 nm to about 500 nm, or any thickness or range of thickness within that range to minimize, mitigate or eliminate damage of the encapsulating layer portion 128. In some aspects the encapsulating layer portion 128 can comprise multiple encapsulating layers of alternating or different materials, e.g. second encapsulating layer 110 and third encapsulating layer 112, in some aspects each having substantially similar thickness, as shown in FIG. 3B. The encapsulating layer portion 128 can also comprise a single encapsulating layer, or a combination of multiple layers of encapsulant to form a single encapsulating layer, disposed over the first encapsulating layer 106. Such an encapsulating layer portion 128 comprising a single layer can have a thickness for example of from about 100 nanometers (nm) to about 1 micron (um). The thickness can in some aspects be for example from about 100 nm to about 500 nm, or any thickness or range of thickness within that range.

Such a configuration can reduce, eliminate or minimize cracking, pin holes or damage of layer 106. Encapsulating layers 110 and 112 can be considered an additional or supplementary encapsulating layer, and can form a encapsulating layer portion 128 along with encapsulating layer 106. Thus, in some aspects encapsulating layers 110 and 112 can be configured to provide additional protection to reflective surface 104 by preventing exposure to environmental elements.

Similarly, FIG. 3C is a cross-sectional view of LED device 100 comprising substrate 102, reflective layer 104, encapsulating layer 106, and optional LED chip 114. In some aspects, a plurality of encapsulating layers 110 and 112 can be added to encapsulating layer 106 to form a single or plurality of encapsulating layers of a desired thickness. In some embodiments, and as illustrated in FIG. 3C, substrate 102 with reflective surface 104, or reflective layer, comprises encapsulating layer portion 128 disposed over the reflective layer, wherein the encapsulating layer portion 128 comprises at least a first encapsulating layer 106, a second encapsulating layer 110, and third encapsulating layer 112, disposed over the first encapsulating layer 106. Such a encapsulating layer portion 128, i.e. first encapsulating layer 106, second encapsulating layer 110, and third encapsulating layer 112 combined, can have a thickness of at least about 100 to about 1 micron (um) or other sub-ranges as noted herein to minimize or eliminate damage to the encapsulating layer portion 128, and particularly first encapsulating layer 106. In some aspects, the encapsulating layer portion 128 can comprise multiple encapsulating layers of alternating or different materials, e.g. second encapsulating layer 110 and third encapsulating layer 112, in some aspects each having substantially different thicknesses as shown in FIG. 3C.

FIGS. 4A-4B are cross-sectional views of embodiments of substrate arrangements for LED components or devices. LED device 120 can comprise a substrate 102 having a rough upper surface 122. Substrate 102 can be a metal or bare metal layer, including for example aluminum. Smoothing layer 124 can be applied or adhered to rough upper surface 122 to create a smoother surface. In some embodiments, the upper substrate surface is devoid of a silver (Ag) layer.

As shown in FIG. 4A, a distributed Bragg reflector (DBR) 126, or other non-metal reflective layer, generally referred to as a dielectric reflector, can be applied to smoothing layer 124. Additionally, as shown in FIG. 4B, smoothing layer 124 can be a dielectric layer, and can in some aspects comprise one or more dielectric layers, including for example dielectric layers 110 and 112.

LED device 120 can serve as a substrate for a LED or LED device. Both FIGS. 4A and 4B show an optional LED 114 disposed above and/or attached to DBR 126. LED 114 can in some embodiments comprise a top-side contact LED, which can include electrical connection 116 and one or more wire bonds 118. Although only shown with one exemplary LED 114, multiple LEDs can be provided on such a substrate, and interconnected or electrically connected. LED device 120, including substrate 102 with improved functionality and reliability, can be used in an LED device or lighting system. In some aspects, the entire LED device 102 can be covered by an encapsulating layer, for example a standard epoxy/silicone encapsulating layer with phosphor and/or other material.

Methods of preparing a substrate for a LED, including the above embodiments, are also provided. Such methods can comprise providing a substrate comprising an upper substrate surface and a reflective layer disposed on the upper substrate surface, and disposing a encapsulating layer portion over the reflective layer, wherein the encapsulating layer portion comprises at least a first encapsulating layer and a second encapsulating layer disposed over the first encapsulating layer. The encapsulating layer portion can have a thickness for example of from about 100 nanometers (nm) to about 1 micron (um). The thickness can in some aspects be for example from about 100 nm to about 500 nm, or any thickness or range of thickness within that range.

In another embodiment, LED substrates and devices are provided with a pre-die attached filling for use with topside contact LED chips. Current methods of post-attach dispensing of filling material can result in light trap when using clear attach material for LED dies or chips since the attach material can gather around the perimeter of the die or chip. Additionally, filler material applied after attachment or placement (post-attach) of LEDs can also result in filler material or encapsulant on top of the chips, or incomplete or thin fill due to incomplete spread or too much solvent required. As disclosed herein, by using a pre-die attach approach with filler material the LEDs can be encapsulated in the fill material with the fill material having a desired configuration, such as an even thickness or shaped using a molding process.

Such fill materials are preferably materials that have a small particle size to keep thermal resistance low. The fill materials can include white fill materials, for example but not limited to $TiO_2$, $Al_2O_3$, etc., that can act as reflector, or black fill materials, for example but not limited to $Fe_3O_4$, etc., that can provide high contrast. Flood or fill materials can include silicone, epoxy, etc., with or without solvent. In some embodiment's phosphor, particularly for white parts, can be incorporated in flood or fill material, or in subsequent phosphor layers, to control color output, e.g. color layering or different mixing affects.

The fill material can be any desired thickness, up to and including the thickness or depth of the LED chips or die. LEDs can be pressed into the uncured material during the die attach process. Alternatively, the fill material can be molded into shapes with gaps between the molded shapes for placement of the LED chips. Such molded shapes can include but is not limited to rounded ridges, triangular ridges, rectangular ridges, half spheres or any combination thereof. Standard die attach material can then be used to attach the LED chips. Such a configuration can provide a reflective surface and/or can control far/near field properties.

FIGS. 5A-5F are cross-sectional views of light emitting diode (LED) devices. The LED devices 130 in FIGS. 5A-5C comprise a substrate 102 and a fill material 136 at least partially covering the upper surface of substrate 102. One or more top-side contact LEDs 114 can be disposed over the upper surface and embedded, placed or pushed into the fill material 136. The LEDs 114 can be embedded in fill material 136 such that a layer (less than 1 um, or about 10 nm, or up to about 100 um) of fill material can in some aspects remain or be disposed under each of the one or more LEDs 114.

LEDs 114 can be placed in fill material 136 when the fill material 136 is uncured, or prior to curing. Or, in some aspects, fill material 136 can be partially cured prior to placing or pushing LEDs 114 into the material. Fill material 136 can be fully cured using ultraviolet light or heat, for example. Upon curing, fill material 136 can bind or otherwise secure LEDs 114 into place.

Fill material 136 can comprise a white fill material, a black fill material, a phosphor fill material, or any combination thereof. By example and not limitation, the white fill material can comprise $TiO_2$, $ZrO_2$, $CeO_2$, or $Al_2O_3$. By example and not limitation, the black fill material can comprise $Fe_3O_4$, graphite, graphene or charcoal. By example and not limitation, the phosphor fill material can comprise phosphor, a ceramic oxide, glass, any white, opaque, scattering, or reflective material, or a combination thereof.

Figure 5A:
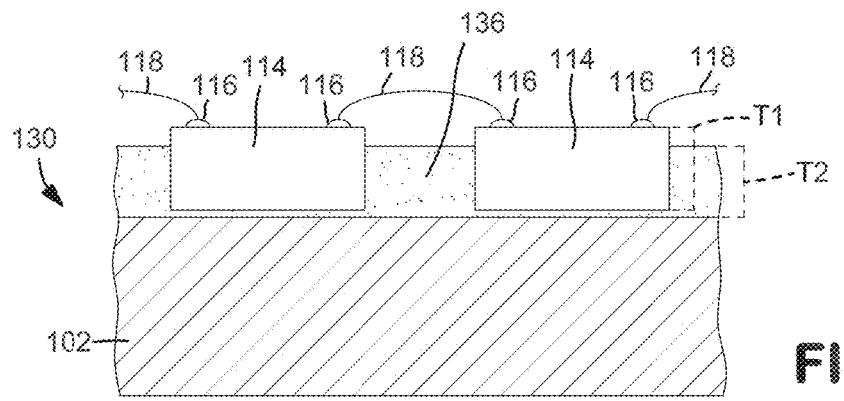
Figure 5B:
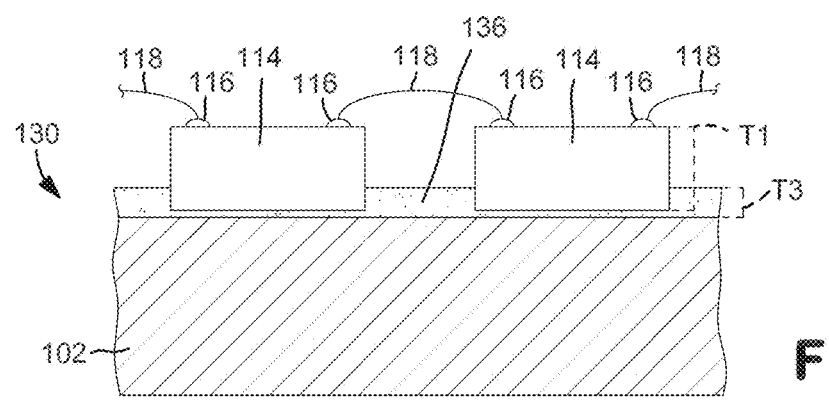

By applying fill material 136 and then placing LEDs 114 fill material can have a substantially uniform thickness. Fill material 136 can have a thickness T2 that extends to or proximate to an upper surface of the one or more LEDs 114. As shown in FIG. 5A, fill material 136 can have a thickness T2 substantially similar to thickness T1 of LEDs 114. Alternatively, as shown in FIG. 5B, fill material 136 can have a thickness T3 substantially less than thickness T1 of LEDs 114.

Figure 5C:
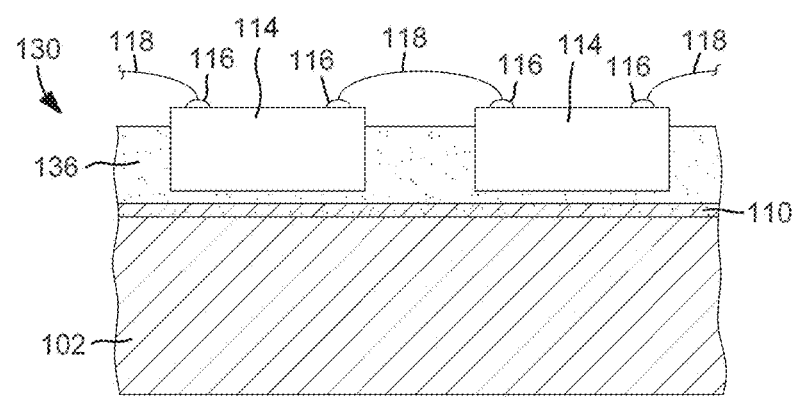

FIG. 5C shows an embodiment with an optional encapsulating layer 110 on an upper surface of substrate 102 and below fill material 136. Encapsulating layer 110 can be applied prior to application of fill material 136 and can be a dispensed or molded layer of can be a thin dielectric layer or distributed Bragg reflector.

Figure 5D:
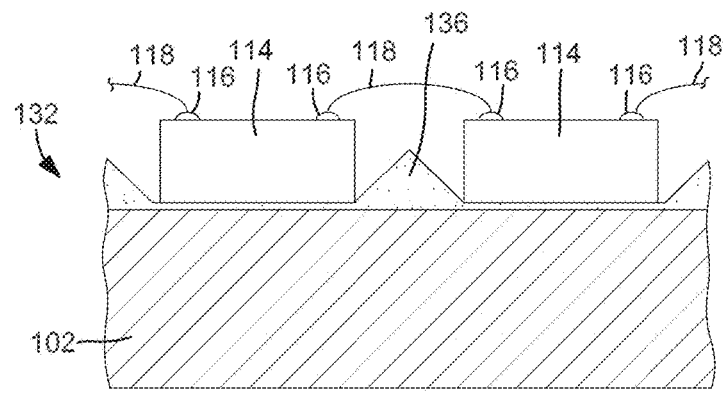
Figure 5E:
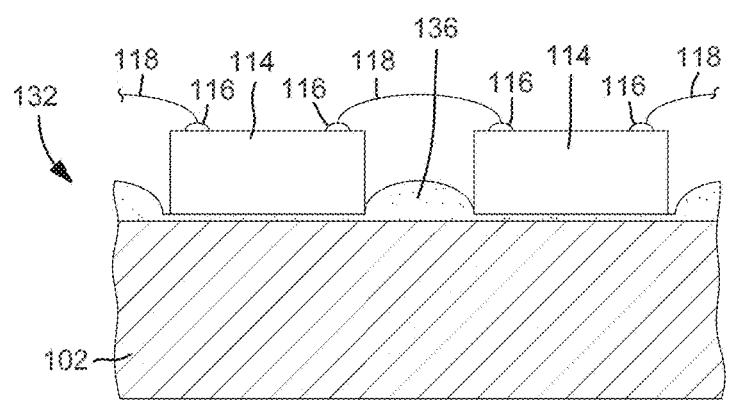

In some embodiments an LED device 132, as shown in FIGS. 5D and 5E, can have a fill material 136 molded in a predetermined shape. The molded shape of fill material 136 can be but is not limited to a rounded ridge, a triangular ridge, a rectangular ridge, a half sphere or any combination thereof. The shapes can be molded with a space therebetween so as to provide a location for placing the one or more LEDs 114. In some embodiments the pre-molded shapes of fill material 136 can be partially cured to allow placement of LEDs 114 without needing a separate die attach material for the LEDs 114. Alternatively, the pre-molded shapes can be completely cured and then the LEDs 114 attached using a die attach material, e.g. epoxy.

Figure 5F:
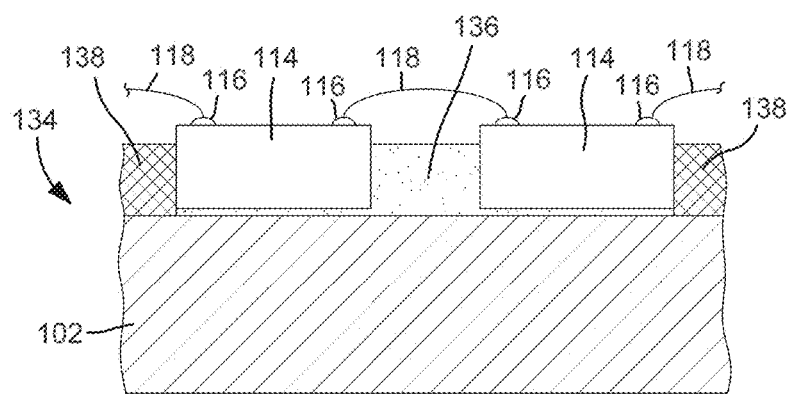

In some embodiments, two or more fill materials can be used. As shown in FIG. 5F, a first fill material 136 (e.g. a white material) can be used along with a second fill material 138 (e.g. a black material). In some embodiments LEDs 114 can be embedded in a first fill material 136, with a second fill material 138 surrounding an outer periphery of the LEDs 114. Such an embodiment can provide for improved light contrast.

In each of FIGS. 5A-5F, LEDs 114 can comprise top-side contact LEDs, which can include electrical connections 116 and one or more wire bonds 118. Although only shown with two exemplary LEDs 114, multiple LEDs can be provided in a configuration or device as shown in FIGS. 5A-5F, and interconnected or electrically interconnected, and a full or complete encapsulating layer can be provided and can include any suitable material(s) such as phosphor for example.

The LED devices of FIGS. 5A-5F can be made by a method of attaching a light emitting diode (LED) to a substrate, comprising providing a substrate as disclosed heron and applying a fill material to an upper surface thereof. Then, one or more top-side contact LEDs can be applied to the substrate by placing or pushing the one or more LEDs into the fill material that is already applied to the upper surface of the substrate. Once the LEDs are placed such that they are embedded in the fill material the fill material can be cured using heat or ultraviolet (UV) light. In some embodiments the fill material is partially or completely uncured prior to applying the one or more LEDs. Moreover, the one or more LEDs can be applied to the substrate such that the layer of fill material disposed between each of the one or more LEDs and the upper surface of the substrate has a thickness of about 1 um or less or up to about 100 um or the thickness of the LED.

In some embodiments the fill material is molded into one or more predetermined shapes prior to application of the LEDs in gaps between the molded shapes. As shown in FIGS. 5D and 5E, the one or more molded shapes can comprise a rounded ridge, a triangular ridge, a rectangular ridge, a half sphere or any combination thereof.

In each of the above embodiments, encapsulating layers, including for example dielectric layers 106, 110, 112 and/or 126, can comprise any number of encapsulants, coatings and/or dielectric materials and compounds, including for example silicon oxide, silicon nitride, aluminum oxide, titanium dioxide, non-metallic oxides, non-metallic nitrides, tantalum oxide, etc. In some embodiments, one or more of the encapsulating layers and/or dielectric layers can also include DBRs or other non-metal reflective layers, generally referred to as dielectric reflectors. The dielectric layers or dielectric layer portions can comprise any mixture of dielectrics and/or DBRs. The encapsulating layers or encapsulating layer portions can be applied by any suitable method for encapsulants, coatings and/or dielectrics and related materials, including for example by sputtering, spraying, gravity sedimentation, centrifugation, addition of a solvent, screen printing, evaporation (sputter, e-beam, thermal, CVD, electrostatic and/or electrophoretic deposition), dipping, spin coating, direct dispensing, and/or vibration, including for example as described in U.S. Pat. Nos. 8,410,679, and 8,425,271, the disclosures of which are each hereby incorporated by reference herein in their entireties.

While the subject matter has been has been described herein in reference to specific aspects, features, and illustrative embodiments, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein.

Aspects disclosed herein can, for example and without limitation, provide one or more of the following beneficial technical effects: reduced cost of providing solid state lighting apparatuses; reduced size, volume, or footprint of solid state lighting apparatuses; improved efficiency; improved color rendering; improved thermal management; simplified circuitry; improved contrast, improved viewing angle; improved color mixing; improved reliability; and/or simplified DC or AC operability.

Various combinations and sub-combinations of the structures and features described herein are contemplated and will be apparent to a skilled person having knowledge of this disclosure. Any of the various features and elements as disclosed herein can be combined with one or more other disclosed features and elements unless indicated to the contrary herein. Correspondingly, the subject matter as hereinafter claimed is intended to be broadly construed and interpreted, as including all such variations, modifications and alternative embodiments, within its scope and including equivalents of the claims.

What is claimed is:

1. A substrate for a light emitting diode (LED), the substrate comprising:
   an upper substrate surface;
   a reflective layer disposed on the upper substrate surface; and
   an encapsulating layer portion disposed over the reflective layer, the encapsulating layer portion having a thickness of at least about 100 nanometers (nm) to about 1 micron (um) to mitigate or eliminate damage of the encapsulating layer portion,
   wherein the encapsulating layer portion comprises a distributed Bragg reflector or other non-metal reflective layer.

2. The substrate of claim 1, wherein the encapsulating layer portion comprises two or more encapsulating layers that are different materials.

3. The substrate of claim 1, wherein the encapsulating layer portion comprises multiple encapsulating layers of alternating materials.

4. The substrate of claim 1, wherein the encapsulating layer portion comprises at least a first encapsulating layer and a second encapsulating layer disposed over the first encapsulating layer, and wherein the first encapsulating layer comprises a different material than the second encapsulating layer.

5. The substrate of claim 1, wherein the encapsulating layer portion comprises at least a first encapsulating layer and a second encapsulating layer disposed over the first encapsulating layer, and wherein the first and second encapsulating layers are substantially a same thickness.

6. The substrate of claim 1, wherein the encapsulating layer portion comprises at least a first encapsulating layer and a second encapsulating layer disposed over the first encapsulating layer, and wherein a thickness of the first encapsulating layer is different from a thickness of the second encapsulating layer.

7. The substrate of claim 1, wherein the substrate is a metal substrate.

8. The substrate of claim 1, wherein the reflective layer comprises a mirrored surface.

9. The substrate of claim 1, wherein the reflective layer comprises silver (Ag).

10. The substrate of claim 1, wherein the encapsulating layer portion comprises a dielectric layer that comprises silicon oxide, silicon nitride, aluminum oxide, titanium dioxide, non-metallic oxides, non-metallic nitrides, tantalum oxide, transparent conducting oxides, non-transparent materials or metals, or a combination thereof.

11. The substrate of claim 1, wherein the encapsulating layer portion comprises at least a first encapsulating layer and a second encapsulating layer disposed over the first encapsulating layer.

12. The substrate of claim 11, wherein the encapsulating layer portion comprises one or more additional encapsulating layers disposed above the first and second encapsulating layers.

13. The substrate of claim 12, wherein at least two or more of the first, second and additional encapsulating layers have a different or same thickness.

14. The substrate of claim 1, further comprising one or more LEDs disposed above the encapsulating layer portion.

15. The substrate of claim 14, wherein the LEDs comprise top-side contact LEDs.

16. A substrate for a light emitting diode (LED), the substrate comprising:
an upper substrate surface;
a reflective layer disposed on the upper substrate surface; and
an encapsulating layer portion disposed over the reflective layer, the encapsulating layer portion having a thickness of at least about 100 nanometers (nm) to about 1 micron (um) to mitigate or eliminate damage of the encapsulating layer portion,
wherein the encapsulating layer portion comprises a distributed Bragg reflector or other non-metal reflective layer.

17. A light emitting diode (LED) device, comprising:
a substrate comprising an upper substrate surface;
a fill material at least partially covering the upper substrate surface; and
one or more top-side contact LEDs comprising an upper surface and lower surface, the LEDs disposed over the upper substrate surface and embedded in the fill material, wherein a layer of fill material is disposed under the lower surface of each of the one or more LEDs.

18. The LED device of claim 17, wherein the fill material has a substantially uniform thickness.

19. The LED device of claim 17, wherein the fill material has a thickness that extends to or proximate to an upper surface of the one or more LEDs.

20. The LED device of claim 17, wherein the fill material comprises a molded shape in a space between the one or more LEDs.

21. The LED device of claim 20, wherein the molded shape is a rounded ridge, a triangular ridge, a rectangular ridge, a half sphere or any combination thereof.

22. The LED device of claim 17, wherein the fill material comprises a white fill material, a black fill material, a phosphor fill material, or any combination thereof.

23. The LED device of claim 22, wherein the white fill material comprises $TiO_2$ or $Al_2O_3$.

24. The LED device of claim 22, wherein the black fill material comprises $Fe_3O_4$.

25. The LED device of claim 22, wherein the phosphor fill material comprises phosphor, a ceramic oxide, glass, any white, opaque, scattering, or reflective material, or a combination thereof.

26. A method of attaching a light emitting diode (LED) to a substrate, the method comprising:
providing a substrate comprising an upper substrate surface;
applying a fill material to the upper substrate surface;
applying one or more top-side contact LEDs to the substrate by placing the one or more LEDS into the fill material that is already applied to the upper substrate surface such that a portion of the fill material is disposed under each of the one or more LEDs; and
curing the fill material.

27. The method of claim 26, comprising applying the one or more LEDs to the substrate wherein a layer of fill material is disposed between each of the one or more LEDs and the upper substrate surface.

28. The method of claim 27, comprising applying the one or more LEDs to the substrate wherein the layer of fill material disposed between each of the one or more LEDs and the upper substrate surface has a thickness of about 1 um or less.

29. The method of claim 26, wherein the fill material is partially or completely uncured prior to applying the one or more LEDs.

30. The method of claim 29, wherein the fill material is cured using ultraviolet light or heat.

31. The method of claim 26, wherein applying the fill material further comprises molding the fill material into one or more predetermined shapes and subsequently applying the LEDs in gaps between the molded shapes.

32. The method of claim 31, wherein the one or more molded shapes comprise a rounded ridge, a triangular ridge, a rectangular ridge, a half sphere or any combination thereof.

33. The method of claim 26, wherein the fill material comprises a white fill material, a black fill material, a phosphor fill material, or any combination thereof.

34. The method of claim 33, wherein the white fill material comprises $TiO_2$ or $Al_2O_3$.

35. The method of claim 33, wherein the black fill material comprises $Fe_3O_4$.

36. The method of claim 33, wherein the phosphor fill material comprises phosphor, a ceramic oxide, glass, any white, opaque, scattering, or reflective material, or a combination thereof.

* * * * *